United States Patent
Bhatti et al.

(10) Patent No.: US 7,650,928 B2
(45) Date of Patent: Jan. 26, 2010

(54) HIGH PERFORMANCE COMPACT THERMOSIPHON WITH INTEGRATED BOILER PLATE

(75) Inventors: Mohinder Singh Bhatti, Amherst, NY (US); Ilya Reyzin, Williamsville, NY (US); David P Rusch, Springville, CA (US); Shrikant Mukund Joshi, Williamsville, NY (US)

(73) Assignee: Coolit Systems Inc., Calgary (CA)

( * ) Notice: Subject to any disclaimer, the term of this patent is extended or adjusted under 35 U.S.C. 154(b) by 262 days.

(21) Appl. No.: 11/731,204

(22) Filed: Mar. 30, 2007

(65) Prior Publication Data

US 2008/0236789 A1  Oct. 2, 2008

(51) Int. Cl.
  *H05K 7/20* (2006.01)
(52) U.S. Cl. ............ 165/80.3; 165/104.33; 165/104.26; 361/700
(58) Field of Classification Search ............ 165/104.33; 361/700
See application file for complete search history.

(56) References Cited

U.S. PATENT DOCUMENTS

| | | | | |
|---|---|---|---|---|
| 5,647,430 A | * | 7/1997 | Tajima | 165/104.33 |
| 5,998,863 A | * | 12/1999 | Kobayashi et al. | 257/715 |
| 6,119,767 A | * | 9/2000 | Kadota et al. | 165/104.33 |
| 6,588,498 B1 | * | 7/2003 | Reyzin et al. | 165/104.33 |
| 6,714,413 B1 | * | 3/2004 | Ghosh et al. | 361/700 |
| 6,834,713 B2 | * | 12/2004 | Ghosh et al. | 165/104.33 |
| 2004/0011511 A1 | * | 1/2004 | Ghosh et al. | 165/104.21 |
| 2004/0070941 A1 | * | 4/2004 | Ghosh et al. | 361/700 |

* cited by examiner

*Primary Examiner*—Allen J Flanigan
(74) *Attorney, Agent, or Firm*—Arent Fox LLP

(57) ABSTRACT

A thermosiphon cooling assembly includes a plurality of hairpin condenser tubes that extend into openings of a boiling chamber for collection of refrigerant vapor from a boiler housing. The distal ends of the tubes extend into the chamber from a cover the least distance midway between the ends of the boiler housing and increase in distance in opposite directions toward the ends. The hairpin tubes are in groups with each tube in a group having the same length and the groups having respectively different lengths and at least one group includes more than one tube.

16 Claims, 4 Drawing Sheets

HIGH PERFORMANCE COMPACT THERMOSIPHON WITH INTEGRATED BOILER PLATE

BACKGROUND OF THE INVENTION

1. Field of the Invention

The subject invention relates to a thermosiphon cooling assembly for cooling an electronic device.

2. Description of the Prior Art

The operating speed of computers is constantly being improved to create faster computers. With this, comes increased heat generation and a need to effectively dissipate heat.

Heat exchangers and heat sink assemblies have been used that apply natural or forced convection cooling methods to dissipate heat from electronic devices that are highly concentrated heat sources such as microprocessors and computer chips. These heat exchangers typically use air to directly remove heat from the electronic devices; however air has a relatively low heat capacity. Thus, liquid-cooled units called LCUs employing a cold plate in conjunction with high heat capacity fluids have been used to remove heat from these types of heat sources. Although LCUs are satisfactory for moderate heat flux, increasing computing speeds have required more effective heat sink assemblies.

Accordingly, thermosiphon cooling units (TCUs) have been used for cooling electronic devices having a high heat flux. A typical TCU absorbs heat generated by the electronic device by vaporizing the working fluid housed on the boiler plate of the unit. The boiling of the working fluid of the TCU is considered to be a two-phase fluid. The vapor generated during boiling of the working fluid is then transferred to a condenser, where it is liquefied by the process of film condensation over the condensing surface of the TCU. The heat is rejected into a stream of air flowing through a tube running through the condenser or flowing over fins extending from the condenser. Alternatively, a second refrigerant can flow through the tube increasing the cooling efficiency. The condensated liquid is returned back to the boiler plate by gravity to continue the boiling-condensing cycle.

An example of a cooling system for electronic devices is disclosed in U.S. Pat. No. 6,834,713 to Ghosh et al.

The Ghosh patent discloses an assembly for cooling an electronic device including a boiler plate presenting an interior surface for transferring heat from the electronic device. A refrigerant is disposed in a boiler housing that extends from the boiler plate and parallel to the boiler plate to define a boiling chamber over the interior surface of the boiler plate. Heat generated by the electronic device dissipates into the housing through the boiler plate causing the refrigerant to boil. The cover of the boiler housing defines a plurality of openings to allow the vapor boiled off the refrigerant to escape from the boiling chamber. A plurality of hairpin condenser tubes presenting spaced legs extend into the openings of the boiler housing for collection of refrigerant vapor. A plurality of fins extend transversely to the legs of the hairpin tubes for transferring heat from the hairpin tubes.

Although the prior art dissipates heat from electronic devices, as computing speeds increase, there is a continuing need for cooling devices having more efficient or alternative heat transfer capabilities as compared to the known electronic cooling assemblies.

SUMMARY OF THE INVENTION AND ADVANTAGES

The invention provides such a thermosiphon cooling assembly for cooling a flat electronic device wherein the plurality of hairpin condenser tubes presenting spaced legs that extend to distal ends are distinguished by the distal ends of the tubes extending into the chamber from the cover the least distance midway between the ends of the boiler housing and increase in distance in opposite directions toward the ends.

Accordingly, the invention is highly responsive to the thermal load imposed on the boiler plate by the electronic device. The variable height hairpin tubes are shortest at the center location of the boiler plate where the most heat is concentrated on the electronic device. The removal of heat from the electronic device is further facilitated by the variable height boiler plate fins which are tallest at the center location of the boiler plate where the heat from the electronic device is the greatest. This results in the most efficient extraction of heat from the electronic device.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
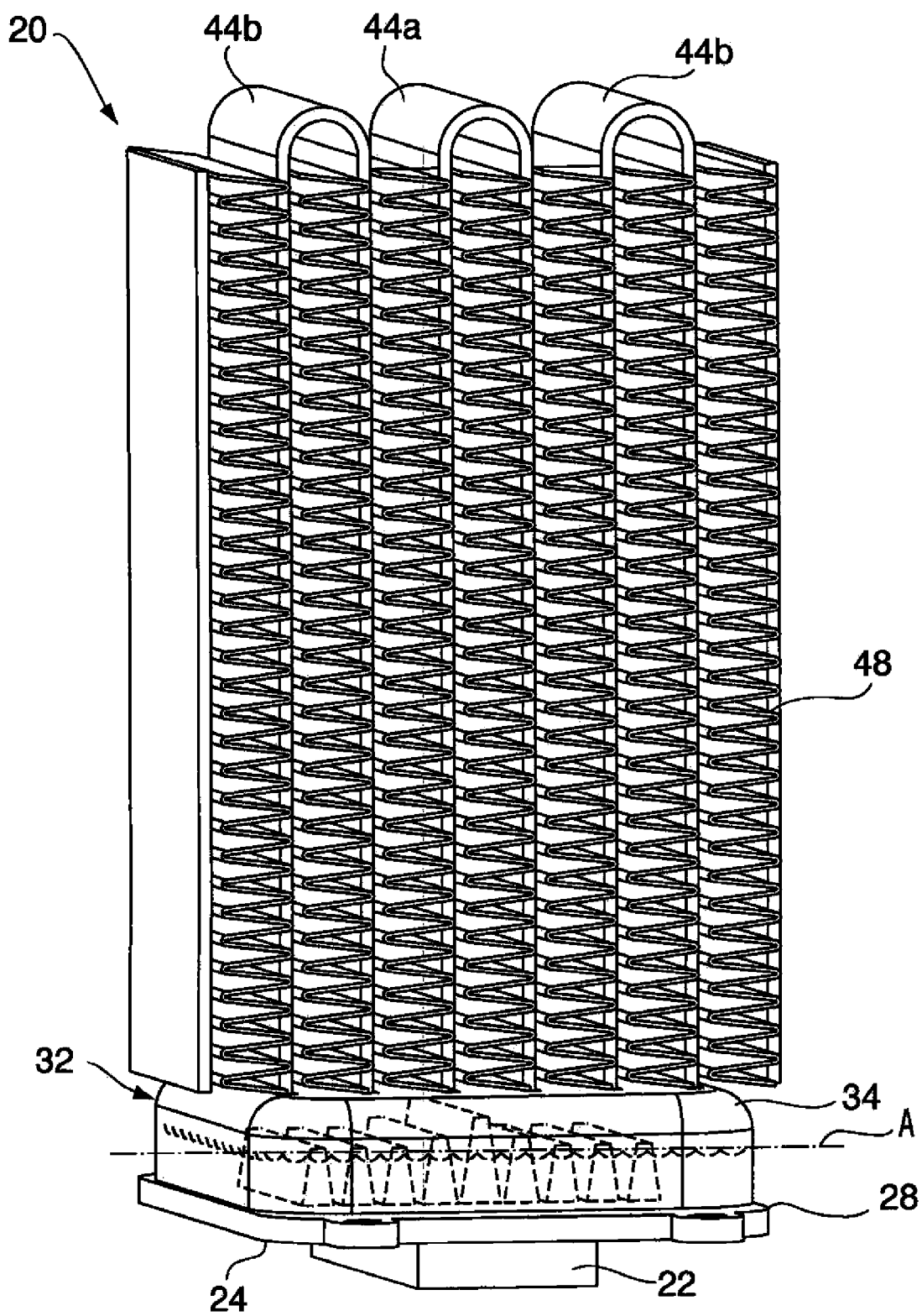
FIG. 1 is a perspective view of a first embodiment.
Figure 2:
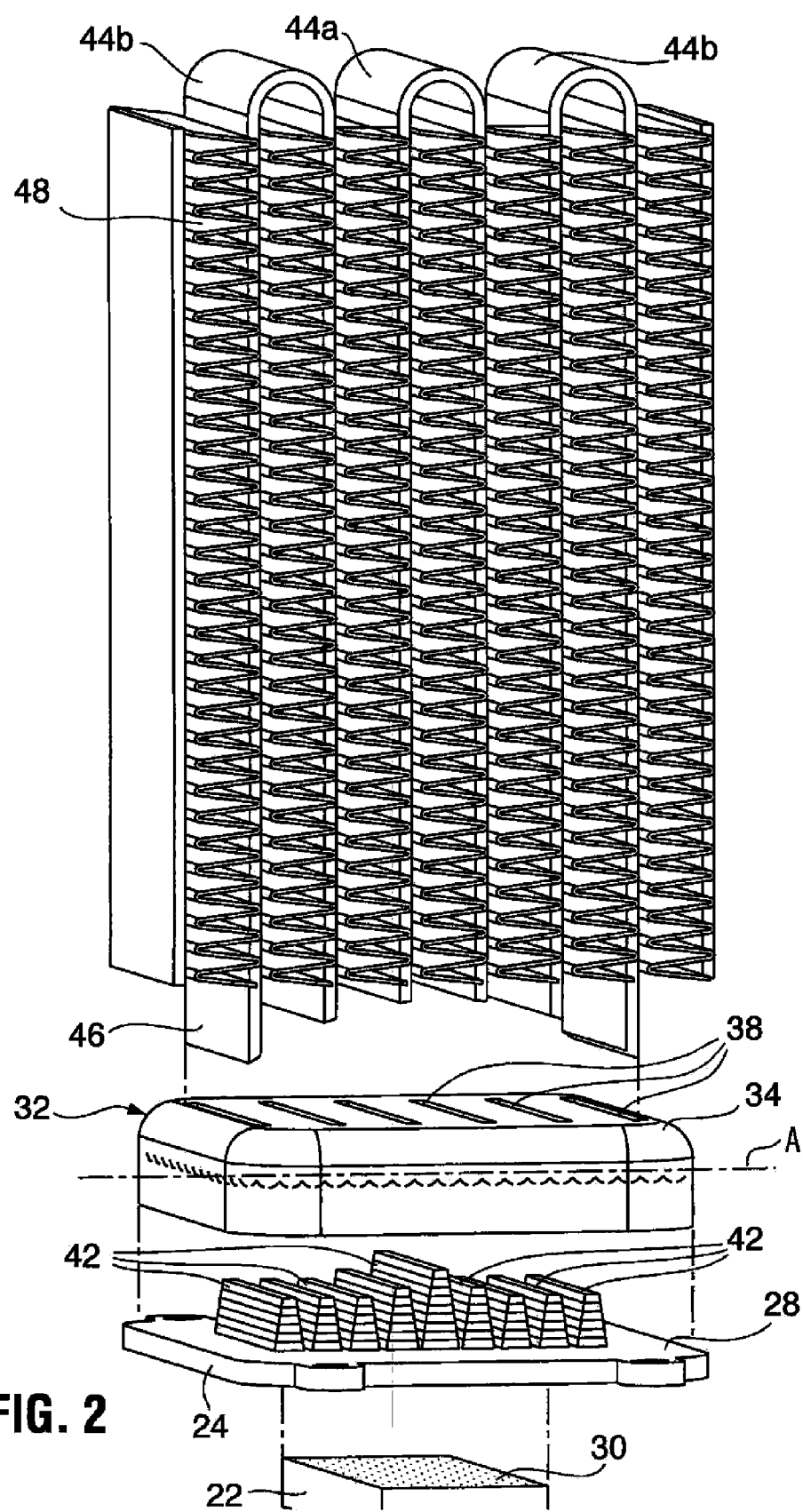
FIG. 2 is an exploded view of the first embodiment.
Figure 3:
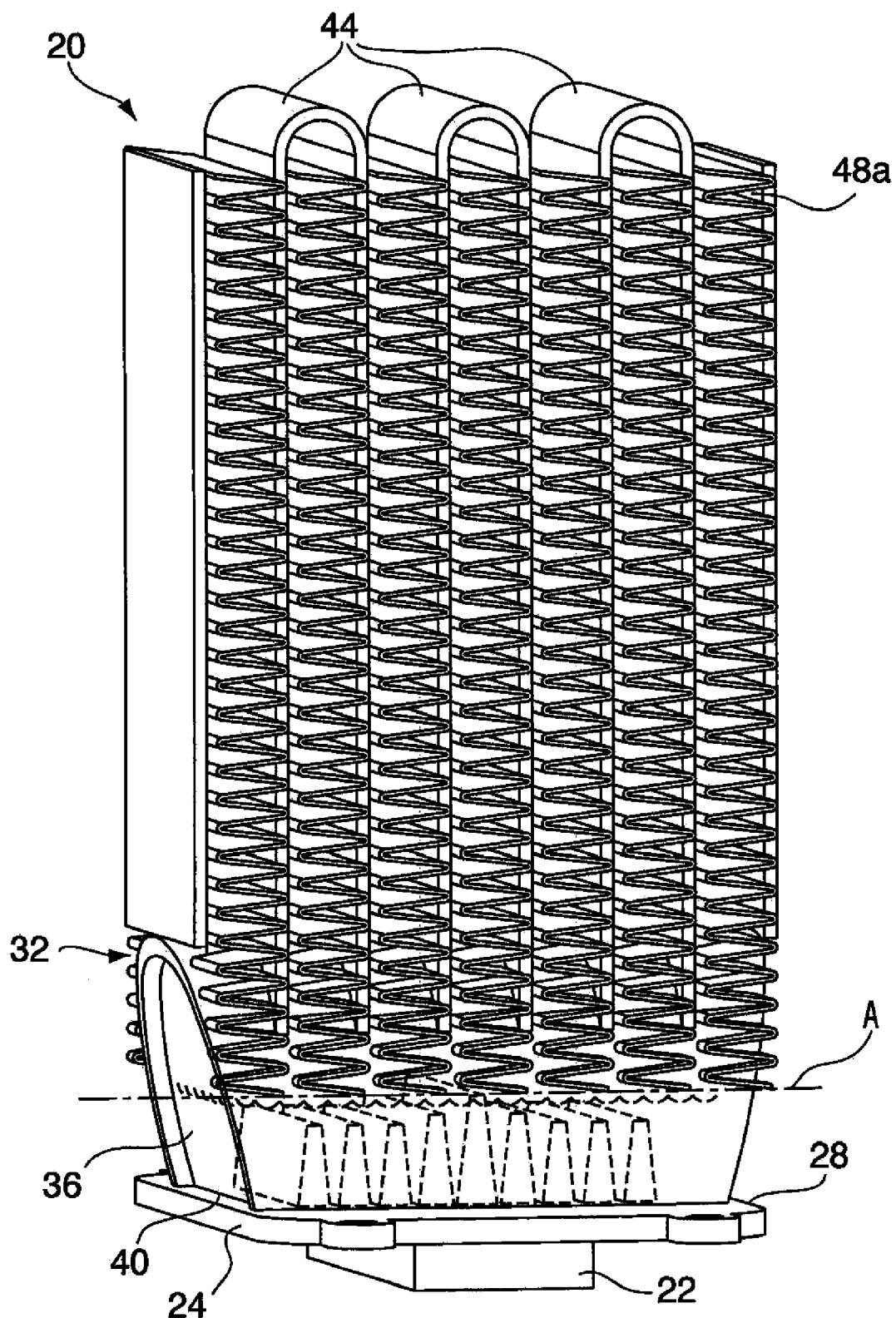
FIG. 3 is a perspective view of a second embodiment.
Figure 4:
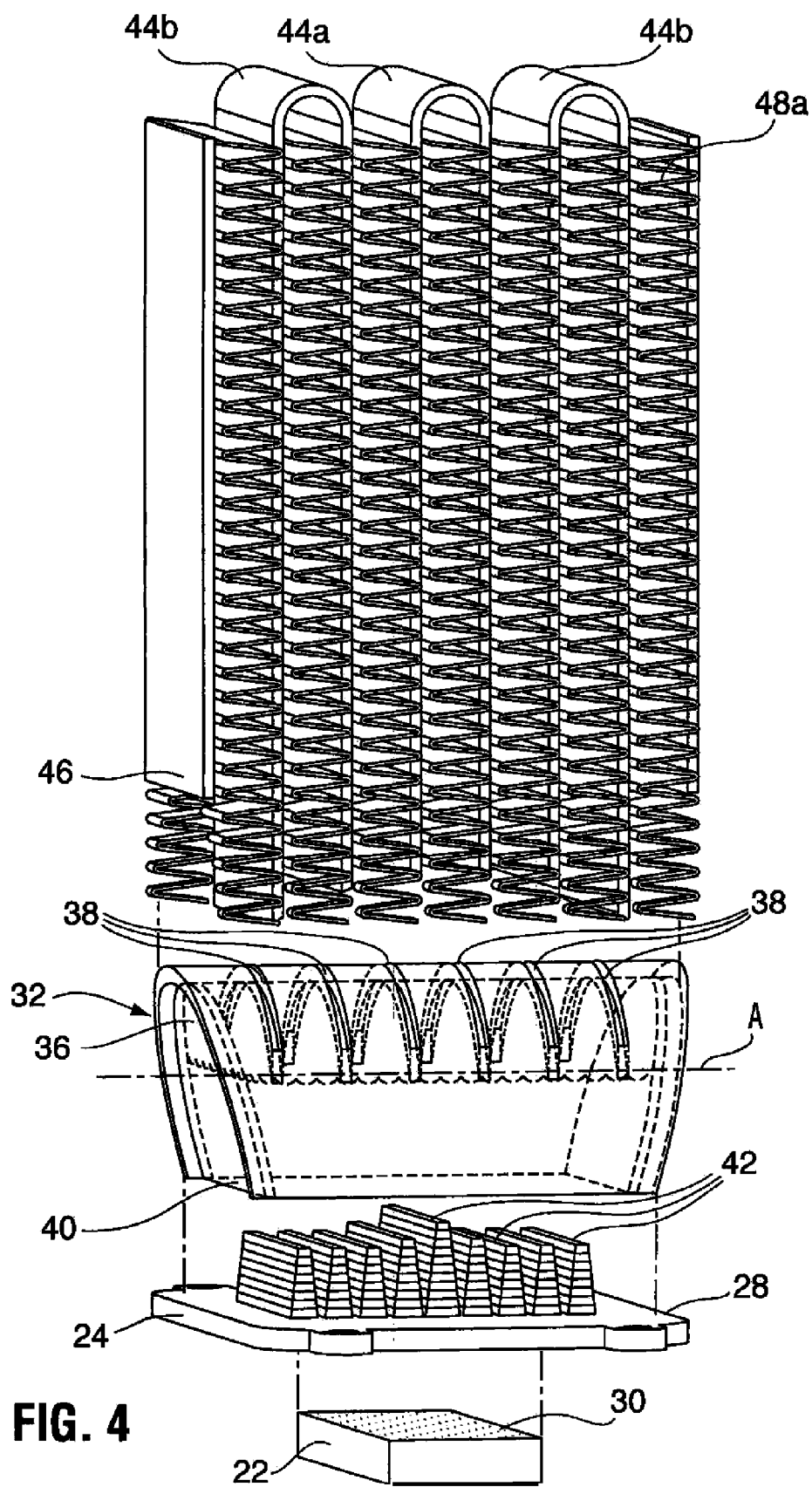
FIG. 4 is an exploded view of the second embodiment.

Referring to the Figures, wherein like numerals indicate corresponding parts throughout the several views, a thermosiphon cooling assembly 20 is generally shown for cooling an electronic device 22 in FIGS. 1, 2, 3 and 4.

The assembly comprises a boiler plate presenting a bottom surface and an oppositely facing interior surface 28 extending between a rectangular periphery for transferring heat from the electronic device. A grease layer 30 is disposed on the bottom surface of the boiler plate for enhancing the thermal interface between the boiler plate and the electronic device. The grease layer fills the microscopic spaces that are created when the boiler plate is placed into contact with the electronic device. No two surfaces, are perfectly flat and these surfaces, contain many microscopic spaces and the grease layer is utilized to fill these spaces.

A boiler housing 32 generally indicated extends from the periphery of the boiler plate and through a closed cover 34. The cover extends along an axis A parallel to the boiler plate between spaced ends to define a boiling chamber over the interior surface of the boiler plate. The cover of the boiler housing defines a plurality of parallel elongated openings 31 disposed side by side in and along a plane perpendicular to the interior surface of the boiler plate. A refrigerant is disposed in the boiling chamber of the boiler housing for liquid to vapor transformation in response to heat from the electronic device. This transfer of heat to the refrigerant leads to a pressure build up in the housing.

A plurality of plate fins 42 extend upward from the interior surface of the boiler plate and are spaced from one another in the plane and along the boiling chamber for enhancing heat transfer from the boiler plate to the refrigerant. The plate fins have the greatest height centrally of the plane and decrease in height in opposite directions along the plane.

The assembly is distinguished by a plurality of hairpin condenser tubes 44a, 44b each having a cross section with flat sides and extending through a U-shape to present spaced legs with distal ends 46. The legs of the tubes extend into the openings of the boiling chamber for collection of vapor from the boiler housing. The distal ends of the tubes extend into the chamber from the cover the least distance midway between the ends of the boiler housing and increase in distance in opposite directions toward the ends. The hairpin tubes are in groups, for example short group 44a and long group 44b, with each tube in a group having the same length and each group having different lengths with at least one group, herein illustrated as the long group 44b, including more than one tube.

The assembly further includes a plurality of parallel louvered fins 48 that extend transversely to the legs of the hairpin tubes and outwardly thereof spaced along the legs of the hairpin tubes for transferring heat from the hairpin tubes.

The assembly may include a boiling chamber that is rectangular in shape and includes rounded corners. This assembly is suitable for use with a refrigerant with a low vapor pressure such as water. If a high vapor pressure refrigerant were used, a leak could occur through the edges and corners of the rectangular shaped boiling chamber due to stress concentration in the corner regions.

The assembly may also include a cover 40 that is cylindrical about an axis with ends 36 that are flat and spaced along the axis from each other and converge towards one another in the direction towards the axis. This assembly may also include louvered fins 48a that are presented in a zig-zag pattern and extend down and around the cylindrical cover of the boiling chamber. This assembly is suitable for use with a refrigerant with a high vapor pressure such as R-134a. The cylindrical shaped boiling chamber has less edges and corners than a rectangular shaped boiling chamber and can withstand higher pressures allowing it to avoid leaks.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A thermosiphon cooling assembly for cooling an electronic device comprising;
   a boiler plate presenting an interior surface for transferring heat from the electronic device to a refrigerant,
   a boiler housing extending from said boiler plate and through a closed cover between spaced ends extending along an axis parallel to said boiler plate to define a boiling chamber over said interior surface of said boiler plate,
   said cover of said boiler housing defining a plurality of openings,
   a plurality of hairpin condenser tubes presenting spaced legs extending to distal ends with said legs extending into said openings for collection of refrigerant vapor from said boiler housing,
   said assembly characterized by said distal ends of said tubes extending into said chamber from said cover the least distance midway between said ends of said boiler housing and increase in distance in opposite directions toward said ends and said hairpin tubes are in groups with each tube in a group having the same length and each group having different lengths with at least one group including more than one tube.

2. The assembly as set forth in claim 1 wherein said cover is cylindrical about an axis and said ends are flat and spaced along said axis from each other and converge towards one another in the direction towards said axis.

3. An assembly as set forth in claim 1 including a plurality of parallel louvered fins extending transversely to said legs of said hairpin tubes and outwardly thereof spaced along said legs of said hairpin tubes for transferring heat from said hairpin tubes.

4. The assembly as set forth in claim 2 including a plurality of louvered fins are presented in a zig-zag pattern and extending down and around said cover of said boiling chamber.

5. An assembly as set forth in claim 1 including a plurality of plate fins extending upward from said interior surface of said boiler plate and spaced from one another in said plane and along said boiling chamber for enhancing heat transfer from said boiler plate to said refrigerant and wherein said plate fins have the greatest height centrally of the line and decrease in height in opposite directions along the line.

6. The assembly as set forth in claim 1 wherein said boiling chamber is rectangular in shape and including rounded corners.

7. An assembly as set forth in claim 1 including a grease layer disposed on said bottom surface of said boiler plate for enhancing the thermal interface between said boiler plate and the electronic device.

8. A thermosiphon cooling assembly for cooling an electronic device comprising;
   a boiler plate presenting a bottom surface and an oppositely facing interior surface extending between a rectangular periphery for transferring heat from the electronic device,
   a grease layer disposed on said bottom surface of said boiler plate for enhancing the thermal interface between said boiler plate and the electronic device,
   a boiler housing extending from said periphery of said boiler plate and through a closed cover extending along an axis parallel to said boiler plate between spaced ends to define a boiling chamber over said interior surface of said boiler plate,
   a refrigerant disposed in said boiling chamber of said boiler housing for liquid to vapor transformation,
   said cover of said boiler housing defining a plurality of elongated openings disposed side by side in a plane perpendicular to said interior surface of said boiler plate,
   a plurality of plate fins extending upward from said interior surface of said boiler plate and spaced from one another in said plane and along said boiling chamber for enhancing heat transfer from said boiler plate to said refrigerant,
   said plate tins having the greatest height centrally along the plane and decrease in height in opposite directions along the plane,
   a plurality of hairpin condenser tubes each having a cross section with flat sides and extending through a U-shape to present spaced legs with distal ends,
   said legs of said tubes extending into said openings for collection of vapor from said boiler housing,
   a plurality of parallel louvered fins extending transversely to said legs of said hairpin tubes and outwardly thereof spaced along said legs of said hairpin tubes for transferring heat from said hairpin tubes,
   said assembly characterized by said distal ends of said tubes extending into said chamber from said cover the least distance midway between said ends of said boiler housing and increase in distance in opposite directions toward said ends and wherein said hairpin tubes are in groups with each tube in a group having the same length and said groups having respectively different lengths and with the tubes at the opposite ends defining a long group having the longest length distal ends and a tube in the middle defining a short group having the shortest length distal ends.

9. The assembly as set forth in claim 8 wherein said boiling chamber is rectangular in shape and including rounded corners.

10. The assembly as set forth in claim 8 wherein said cover is cylindrical about an axis and said ends are flat and spaced along said axis from each other and converging towards one another in the direction towards said axis.

11. The assembly as set forth in claim 10 wherein said louvered fins are presented in a zig-zag pattern and extend down and around said cylindrical cover of said boiling chamber.

12. A thermosiphon cooling assembly for cooling an electronic device comprising;
   a boiler plate presenting an interior surface for transferring heat from the electronic device to a refrigerant,
   a boiler housing extending from said boiler plate and through a closed cover between spaced ends extending along an axis parallel to said boiler plate to define a boiling chamber over said interior surface of said boiler plate,
   said cover of said boiler housing being cylindrical about an axis and said ends are flat and spaced along said axis from each other and converge towards one another in the direction towards said axis and said cover of said boiler housing defining a plurality of openings, and
   a plurality of hairpin condenser tubes presenting spaced legs extending to distal ends with said legs extending into said openings for collection of refrigerant vapor from said boiler housing, said distal ends of said tubes extending into said chamber from said cover the least distance midway between said ends of said boiler housing and increase in distance in opposite directions toward said ends.

13. The assembly as set forth in claim 12 wherein said hairpin tubes are in groups with each tube in a group having the same length and each group having different lengths with at least one group including more than one tube.

14. The assembly as set forth in claim 12 including a plurality of parallel louvered tins extending transversely to said legs of said hairpin tubes and outwardly thereof spaced along said legs of said hairpin tubes for transferring heat from said hairpin tubes.

15. The assembly as set forth in claim 12 including a plurality of louvered fins presented in a zig-zag pattern and extending down and around said cover of said boiling chamber.

16. The assembly as set forth in claim 12 including a plurality of plate fins extending upward from said interior surface of said boiler plate and spaced from one another in said plane and along said boiling chamber for enhancing heat transfer from said boiler plate to said refrigerant and wherein said plate fins have the greatest height centrally of the line and decrease in height in opposite directions along the line.

* * * * *